United States Patent [19]

Seidler

[11] Patent Number: 4,712,850

[45] Date of Patent: Dec. 15, 1987

[54] TERMINAL STRIP WITH ATTACHED SUPPORT AND METHOD OF MANUFACTURE

[75] Inventor: Jack Seidler, Flushing, N.Y.

[73] Assignee: North American Specialties Corp., Flushing, N.Y.

[21] Appl. No.: 336,924

[22] Filed: Jan. 4, 1982

[51] Int. Cl.[4] ............................................ H01R 11/22
[52] U.S. Cl. .................................. 439/861; 439/877; 439/816; 439/894
[58] Field of Search .......... 339/17 LM, 17 M, 220 R, 339/220 M, 258 R, 258 P, 276 SF, 278 M

[56] References Cited

U.S. PATENT DOCUMENTS

| | | | |
|---|---|---|---|
| 3,713,079 | 1/1973 | Dechelette | 339/258 R |
| 3,764,955 | 10/1973 | Ward | 339/220 R |
| 4,120,558 | 10/1978 | Seidler | 339/275 T |
| 4,384,757 | 5/1983 | Andrews, Jr. et al. | 339/17 M |

Primary Examiner—Gil Weidenfeld
Assistant Examiner—P. Austin
Attorney, Agent, or Firm—Darby & Darby

[57] ABSTRACT

A terminal strip comprises a plurality of edge clips for attachment to contact pads on a circuit bearing board, in which each clip is crimped onto a non-conductive carrier bar or strip for supporting the clips. The clips are formed in a stamping process and are crimped to the non-conductive carrier strip during the stamping process.

4 Claims, 8 Drawing Figures

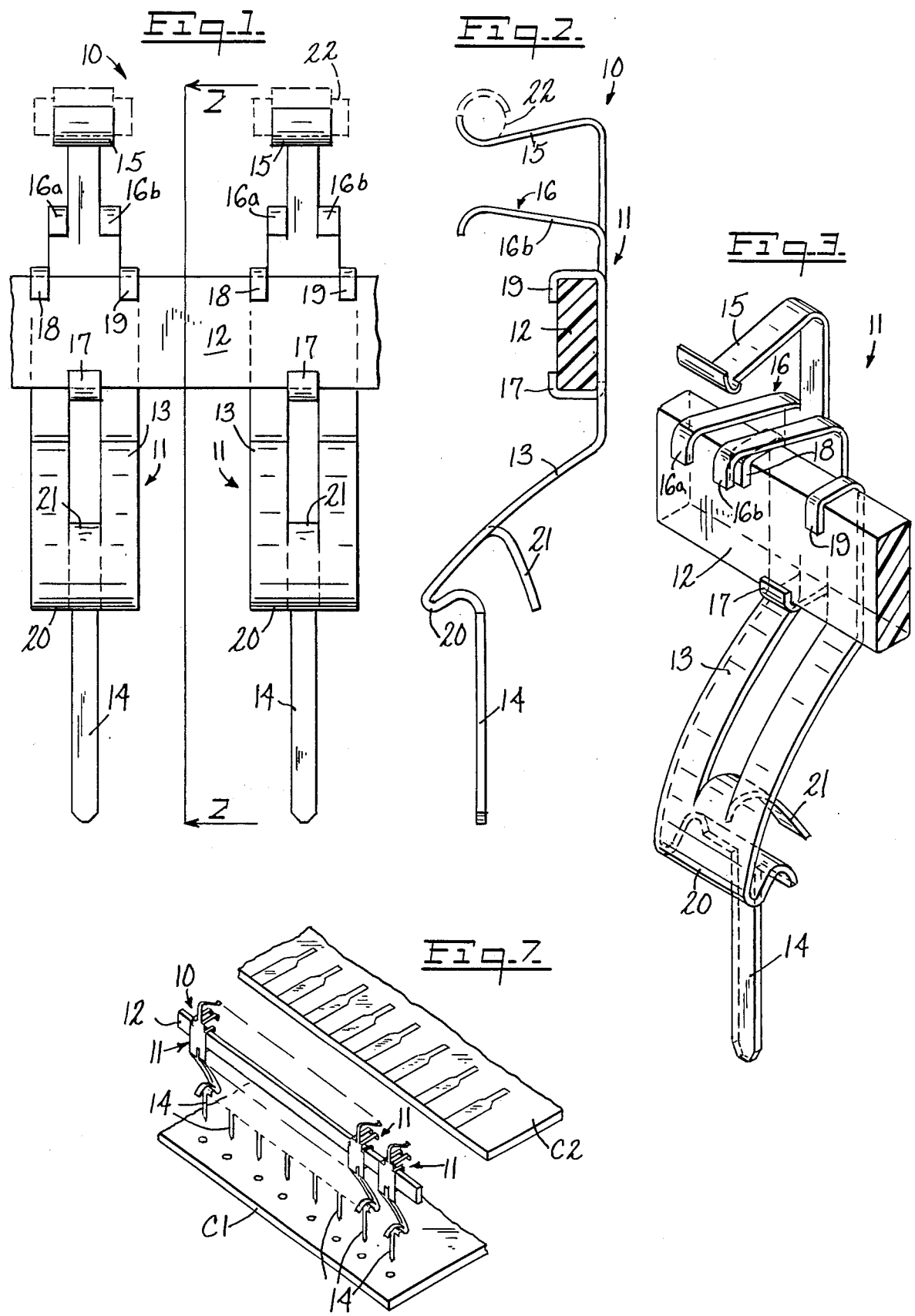

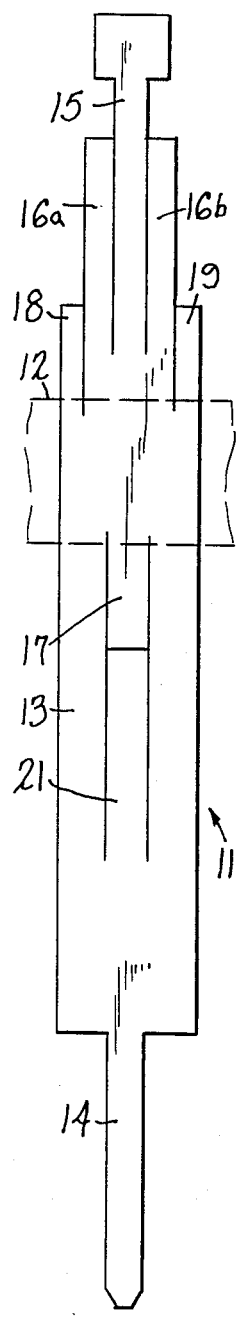
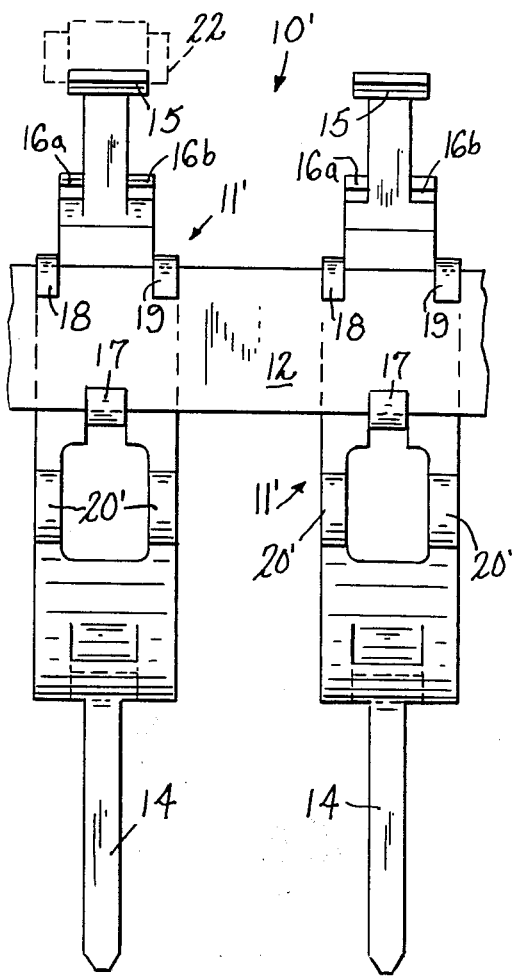
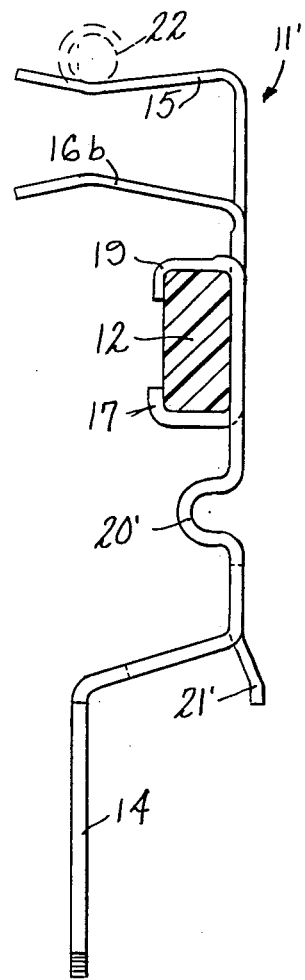
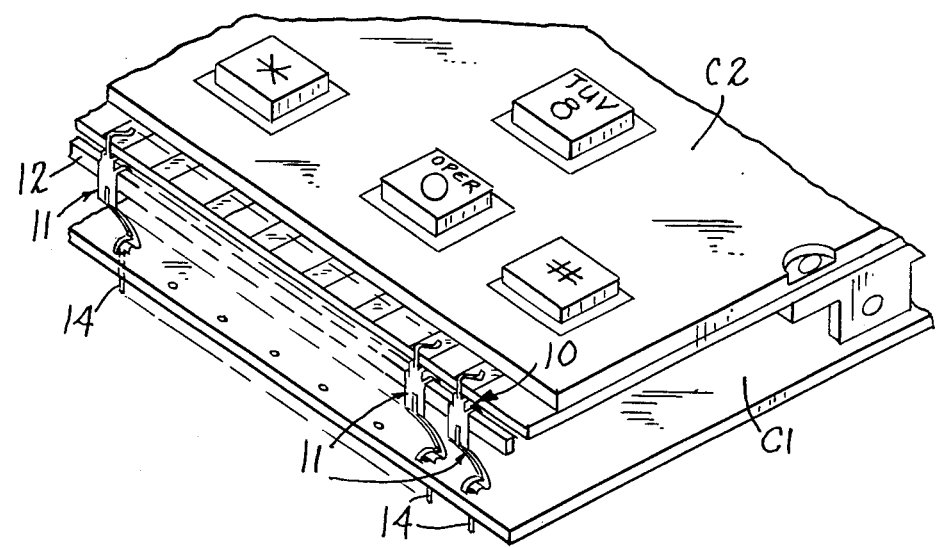

TERMINAL STRIP WITH ATTACHED SUPPORT AND METHOD OF MANUFACTURE

BACKGROUND OF THE INVENTION

1. Field of the Invention

This invention relates generally to terminal or edge clips for attachment to contact pads on a circuit-bearing board and, more particularly, relates to a strip of such clips supported together in pre-determined position for subsequent attachment to a circuit-bearing board.

2. Prior Art

Many different configurations and arrangements are known in the art for terminal strips, including an arrangement wherein an elongate, continuous support bar is molded around the bodies of a plurality of terminal or edge clips after the clips are manufactured. Also known are such arrangements wherein the support bar is snapped around the bodies of the clips after they are manufactured to support a plurality of the clips in a strip for subsequent attachment to a circuit element.

Typically, a terminal strip is comprised of a plurality of clips carried by a carrier strip or rail at one end thereof and formed integrally with the clips during the manufacturing process. Some applications, however, make use of an interconnect or stand-off carried by the bodies of the clips between the ends thereof so that the ends may be joined to the different circuit elements. For instance, such a strip of interconnected terminals may be used to join circuit components in telephone construction. These constructions typically utilize the subsequently molded or snap-on interconnect or stand-off as noted previously.

Such prior art constructions and methods, however, require that the terminals first be manufactured in a stamping process and subsequently be subjected to a further manufacturing process wherein the interconnect is molded to the clips or snapped thereto, as the case may be. Such an approach is time consuming and costly.

SUMMARY OF THE INVENTION

Accordingly, it is a principal object of this invention to provide a strip of terminal or edge clips which are manufactured and assembled to a carrier bar or interconnect in a single manufacturing process.

Another object of the invention is to provide an economical terminal strip wherein a plurality of individual terminal or edge clips are crimped to a carrier bar or interconnect to hold the plurality of clips in predetermined fixed positions for subsequent attachment to circuit components.

A further object of the invention is to provide a terminal or edge clip which has means at each end thereof for attachment to circuit components, and a strain relief portion between the ends for accommodating slight variances in the distance between the circuit components connected by the terminal or edge clip.

These and other objects and advantages of the invention are achieved by manufacturing a plurality of terminal or edge clips for attachment to contact pads on a circuit-bearing board. The clips are formed in a stamping process and each clip has bendable tabs. The clips are formed to essentially their final configuration and thereafter are crimped by said tabs to a non-conductive carrier or support bar for supporting a plurality of the clips in predetermined positions for subsequent attachment to circuit components. The manufacturing procedure for the clip, including attachment of the support bar, is accomplished in a single manufacturing process by providing a blank and performing a series of bending operations on the blank in a stamping process to form a terminal clip having bendable tabs thereon and first and second terminal ends for attachment to first and second circuit components. A strip of support material is fed to the clip during the stamping process and the tabs are bent to crimp the strip of support material to the clips, forming a strip of interconnected clips supported by the strip of support material.

Moreover, the clip bodies are formed with a generally serpentine curved portion between the ends thereof, serving as a strain relief portion to accommodate variations in spacing between circuit elements connected by the clips.

BRIEF DESCRIPTION OF THE DRAWINGS

Referring to the drawings, several forms of the invention are illustrated, wherein like reference characters designate like parts throughout the several views, and wherein:

FIG. 1 is a fragmentary plan view of a portion of a terminal strip in accordance with the invention, showing a plurality of clips attached to the carrier bar or strip;

FIG. 2 is a sectional view in elevation taken along line 2—2 in FIG. 1;

FIG. 3 is a fragmentary perspective view showing one of the clips in FIGS. 1 and 2 attached to the carrier bar;

FIG. 4 is a plan view of a typical blank as may be used in the manufacture of the clip in FIGS. 1 through 3;

FIG. 5 is a view similar to FIG. 1 of a modified form of the clip;

FIG. 6 is a view similar to FIG. 2 of the clip of FIG. 5;

FIG. 7 is an exploded perspective view showing the manner in which the terminal strip of the invention is used to interconnect plural circuit components; and FIG. 8 shows the elements of FIG. 7 joined together, in association with further components comprising a telephone construction.

DETAILED DESCRIPTION OF THE PREFERRED EMBODIMENTS

A first form of the invention is shown in FIGS. 1 through 4 wherein a terminal strip 10 includes a plurality of terminal or edge clips 11 crimped to a support bar or strip 12 extending past the clips to rigidly support the clips in predetermined position for subsequent attachment to circuit components. In this form of the invention, the clips 11 comprise a body 13 having a reduced width stem or pin 14 on one end thereof for attachment to a first circuit component C1, and spaced-apart spring fingers 15 and 16 on the other end for attachment to a second circuit component C2 (see FIG. 7). As seen in FIG. 1, the spring finger 16 comprises a pair of spaced fingers 16a and 16b on laterally opposite sides of the finger 15.

The clip is crimped to the support bar or strip 12 by means of a bottom center tab 17 stamped from the body 13 and crimped upwardly about the bottom of the bar 12, and a pair of side top tabs 18 and 19 at the opposite sides of the body 13 crimped downwardly over the top of the support bar 12, thereby providing a plurality of spaced support points for holding the clip on the bar, insuring stable connection thereof.

As seen particularly in FIGS. 2, 3, and 4, the body 13 is formed with a double reverse curvature of S-shaped configuration 20 at the lower end thereof near the juncture with the stem or pin end 14 to define a strain or stress relief portion, whereby the clip can accommodate slight variations in spacing between circuit components to which the opposite ends of the clip are respectively connected.

A prop or auxiliary support tab 21 is formed from the center of the body 13 and is bent in a rearward direction to engage the top of the first circuit component (C1 in FIG. 7).

While the support bar or strip 12 is shown as rectangular in cross section, it could have other cross-sectional configurations if desired. Additionally, while the spring fingers 15 and 16 are shown without solder, one or both of the fingers could be provided with a mass of solder 22 as shown in dot and dash lines in FIGS. 1 and 2, for example.

A modification of the invention is illustrated in FIGS. 5 and 6, wherein the terminal strip 10' comprises a plurality of terminal or edge clips 11' crimped to a carrier or support bar or strip 12 by means of bent tabs 17, 18 and 19 as in the previous form of the invention. The clips 11' have stem or pin ends 14 and spaced spring fingers 15 and 16a, 16b. This form of the invention differs from the form previously described in that the stress or strain relief section 20' is formed differently and comprises a U-shaped configuration 20' as opposed to the S-shaped configuration 20 in the previous form of the invention. Further, the auxiliary support prop 21' is a downwardly and rearwardly projecting tab below the U-shaped strain relief configuration 20' rather than the tab 21 above the S-shaped configuration 20 as in the previous form of the invention. In all other respects, this form of the invention is substantially the same as that previously described. The support bar 12 comprises a non-conductive material, and may be a continuous nylon extrusion, for example.

Although particular end terminations and configurations of bendable tabs have been illustrated and described, other end terminations and tab arrangements could be utilized within the context of the invention.

It will thus be seen that the objects set forth above, among those made apparent from the preceding description, are efficiently attained and, since certain changes may be made in the above article without departing from the spirit and scope of the claims appended hereto, it is intended that all matter contained in the description and shown in the accompanying drawings shall be interpreted as illustrative and not in a limiting sense.

I claim:

1. A terminal strip comprising:
   a plurality of edge clips having upper and lower ends adapted respectively for attachment to contact pads on a circuit-bearing board, and to another circuit component each of said clips having been formed in a stamping process and having a body portion;
   upper and lower bendable tabs stamped from said body portion and projecting laterally therefrom; and
   an elongate support bar of non-conductive material and of a uniform cross-section along its length, the support bar being crimped to said clips by said tabs during the stamping process, and serving to support the clips in predetermined position for subsequent attachment to circuit components.

2. A terminal strip as in claim 1, wherein:
   another tab is formed on each clip body portion, projecting from said body portion toward said lower end to contact said other circuit component and define a prop providing support to the clip.

3. A terminal strip as in claim 2, wherein:
   the lower end comprises an elongate pin for insertion in a hole in a first circuit board; and
   the upper end comprises spring fingers for receiving the edge of a second circuit board therebetween.

4. A terminal strip as in one of claims 1, 2, or 3, wherein:
   the support bar is a continuous nylon extrusion.

* * * * *